United States Patent
Curtis et al.

(10) Patent No.: US 7,450,380 B2
(45) Date of Patent: Nov. 11, 2008

(54) COMPUTER SYSTEM HAVING MULTI-DIRECTION BLOWER

(75) Inventors: Robert B. Curtis, Al'en, TX (US); Eric C Peterson, McKinney, TX (US); Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 11/552,707

(22) Filed: Oct. 25, 2006

(65) Prior Publication Data

US 2008/0101020 A1    May 1, 2008

(51) Int. Cl.
*H05K 7/20* (2006.01)
(52) U.S. Cl. ...................................... 361/695; 361/694
(58) Field of Classification Search ................... 361/687
See application file for complete search history.

(56) References Cited

U.S. PATENT DOCUMENTS

| | | | |
|---|---|---|---|
| 5,395,410 A * | 3/1995 | Jang | ............................ 55/471 |
| 5,409,352 A | 4/1995 | Lin | |
| 5,431,216 A | 7/1995 | Ogushi et al. | |
| 6,457,955 B1 | 10/2002 | Cheng | |
| 6,652,225 B2 | 11/2003 | Esa | |
| 6,698,505 B2 | 3/2004 | Lopatinsky et al. | |
| 6,723,146 B2 | 4/2004 | Ninomiya et al. | |
| 6,752,201 B2 | 6/2004 | Cipolla et al. | |
| 6,778,390 B2 * | 8/2004 | Michael | ...................... 361/695 |
| 7,051,791 B2 * | 5/2006 | Hashimoto et al. | ......... 165/80.3 |
| 2003/0066627 A1 | 4/2003 | Lin et al. | |
| 2004/0012923 A1 * | 1/2004 | Chen | .......................... 361/687 |
| 2004/0197192 A1 | 10/2004 | Jarrah et al. | |
| 2005/0123398 A1 * | 6/2005 | Tam et al. | ................ 415/211.2 |
| 2006/0019597 A1 * | 1/2006 | Beitelmal et al. | ........... 454/184 |

* cited by examiner

Primary Examiner—Gregory D Thompson

(57) ABSTRACT

A computer system comprises a chassis and first and second electronic components disposed within the chassis. The computer system also comprises a multi-direction blower module having a blower housing connected to the chassis. The blower housing comprises an inlet, a first outlet, and a second outlet. A centrifugal blower is rotatably mounted within the blower housing. An internal wall is disposed within the blower housing and partially surrounds the blower. The airflow into the inlet is passed in thermal communication with the first electronic component. The airflow from the first outlet is passed in thermal communication with the second electronic device. The airflow from the second outlet is exhausted from the chassis.

20 Claims, 2 Drawing Sheets

COMPUTER SYSTEM HAVING MULTI-DIRECTION BLOWER

BACKGROUND

Densification of computer systems is advancing at a rate that creates many challenges with controlling the temperature within dense computer systems A combination of high power components, which generate high levels of heat, and compact design, which limits cooling capacity, is pushing the limits of current air-cooled systems. Air-cooled systems often utilize an array of fans to move air from the environment, through a computer enclosure, and back to the environment. As the air passes through the enclosure it comes in thermal contact with, and absorbs heat from, the heat generating components within the enclosure. The heat transfer rate that can be achieved by an air-cooled system is a function of the volume of air that can be moved through the enclosure and the temperature of that air

BRIEF SUMMARY

The problems noted above are solved in large part by a computer system comprises a chassis and first and second electronic components disposed within the chassis. The computer system also comprises a multi-direction blower module having a blower housing connected to the chassis. The blower housing comprises an inlet, a first outlet, and a second outlet, A centrifugal blower is rotatably mounted within the blower housing. An internal wall is disposed within the blower housing and partially surrounds the blower. The airflow into the inlet is passed in thermal communication with the first electronic component. The airflow from the first outlet is passed in thermal communication with the second electronic device. The airflow from the second outlet is exhausted from the chassis.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect electrical connection via other devices and connections

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
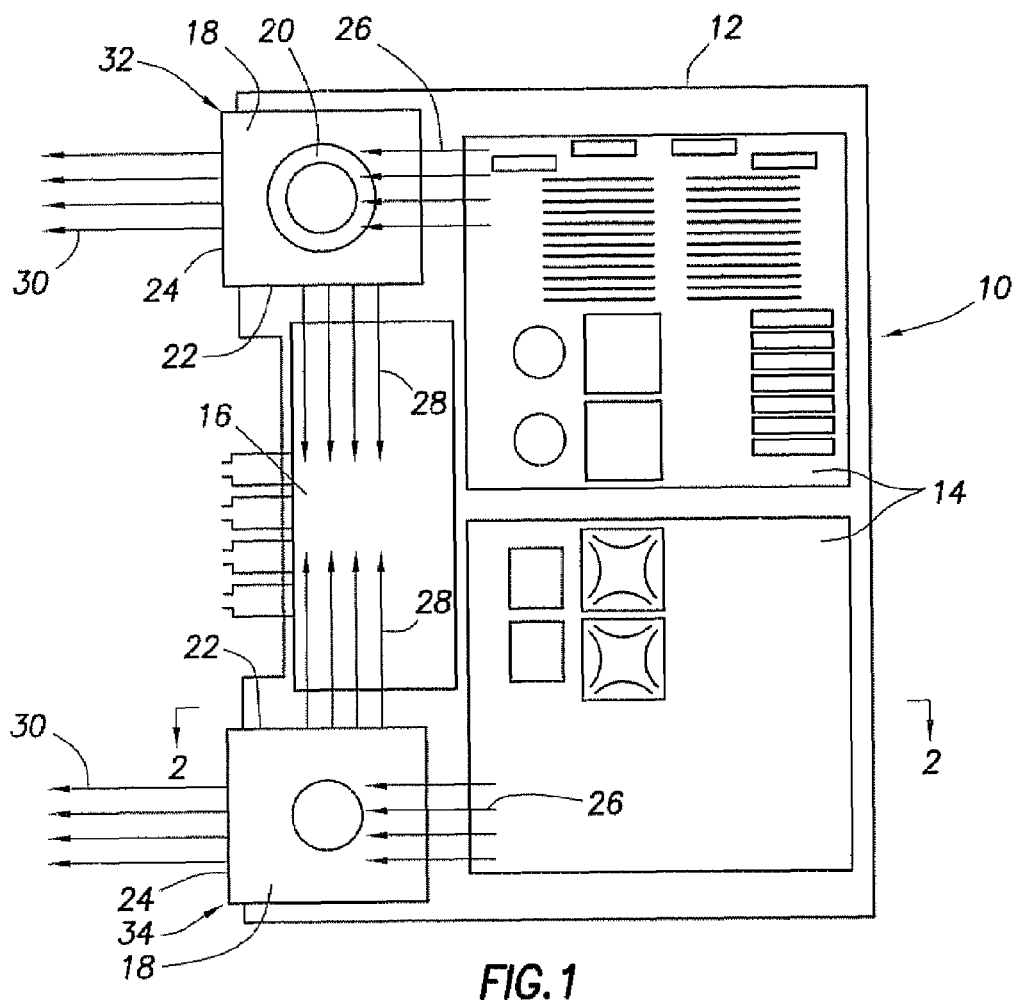
FIG. 1 shows a schematic view of a computer system constructed in accordance with embodiments of the invention.

Referring now to FIG. 1, computer system 10 comprises chassis 12, first electronic components 14, second electronic components 16, and blower modules 18. Electronic components 14 and 16 may comprise components such as motherboards, processors, memory, hard drives, interface and expansion cards, power supplies, and other electronic components used in computers. Electronic components 14 and 16 are disposed within chassis 12. Chassis 12 forms an enclosure that substantially surrounds and supports electronic components 14 and 16.

Blower modules 18 are also disposed within chassis 12, Blower modules 18 have inlets 20, first outlets 22, and second outlets 24. Each blower module 18 generates a pressure differential between inlet 20 and outlets 22 and 24 that creates airflow 26 into inlet 20, airflow 28 out of first outlet 22, and airflow 30 out of second outlet 24. Blower modules 18 are arranged in a parallel configuration such that the inlet and outlets of each of the plurality of blower modules are aligned.

Figure 2:
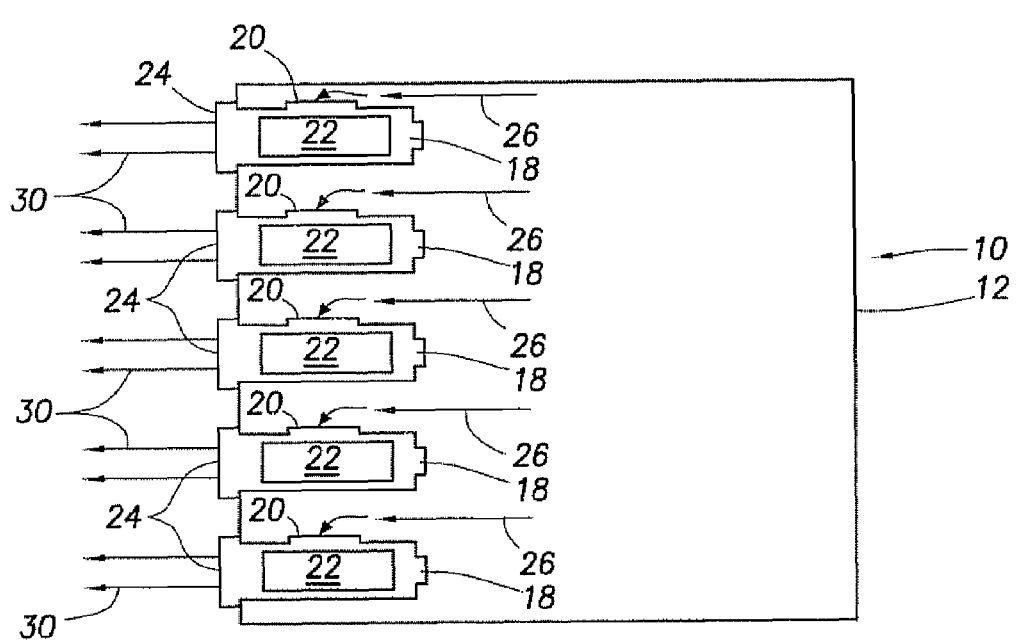
FIG. 2 shows a schematic view of the computer system of FIG. 1.
Figure 3:
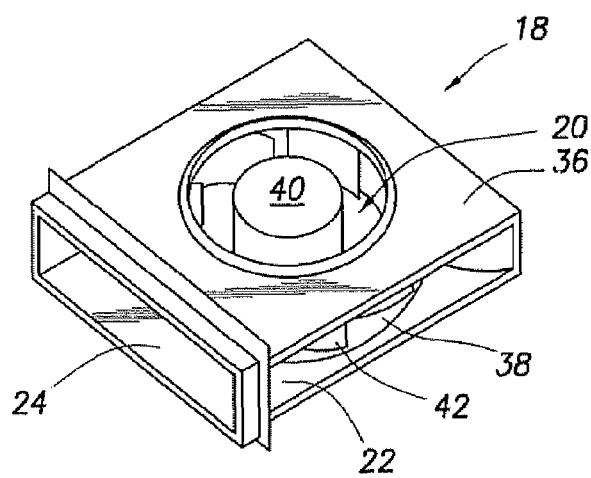
FIG. 3 shows a perspective view of a blower module constructed in accordance with embodiments of the invention.

In the embodiment illustrated in Figures 1 and 2, two sets 32, 34 of five blower modules 18 are arranged in a parallel configuration. The two sets 32, 34 are disposed at opposite ends of chassis 12 such that airflow 28 out of first outlets 22 from both sets of blower modules 18 is directed at second electronic component 16. Airflow 26 moves into inlets 20 of both sets 32, 34 of blower modules 18 and flows across first electronic components 14. Airflow 30 from second outlets 24 of both sets 32, 34 of blower modules 18 is exhausted from chassis 12.

An exemplary blower module 18 is shown in F*igure* 3 comprising blower housing 36 and centrifugal blower 38. Blower housing 36 comprises inlet 20, first outlet 22, and second outlet 24. Centrifugal blower 38 comprises hub 40 and a plurality of blades 42 that push air outward from hub 40 as the blower is rotated about it central axis.

Figure 4:
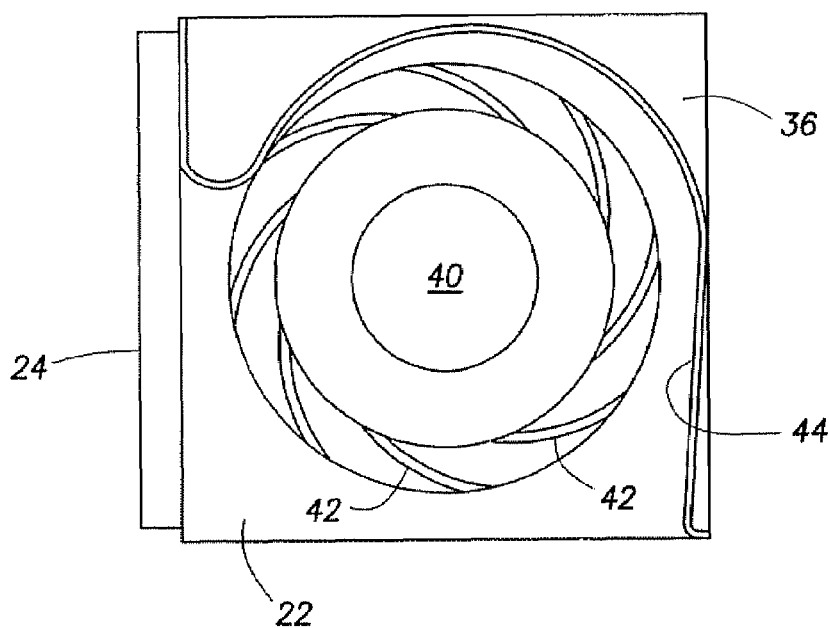
FIG. 4 shows a partial sectional view of the blower module of FIG. 3.

As shown in the partial sectional view of FIG. 4, blower housing 36 further comprises internal wall 44 that is selectively curved. The shape of internal wall 44 is selected so as to direct airflow from blades 42 towards outlets 22 and 24, The shape and configuration of internal wall 44 helps to determine the flow rate and pressure of airflow through outlets 22 and 24. In certain embodiments, internal wall 44 may be structured such that the airflow through the outlets is unbalanced in that airflow through one of the outlets has a greater flow rate or pressure than airflow through the other outlet. In order to create an unbalanced airflow, internal wall 44 may be non-uniformly spaced from the ends of blades 42 so as to create a varying gap between the internal wall and the blades.

Figure 5:
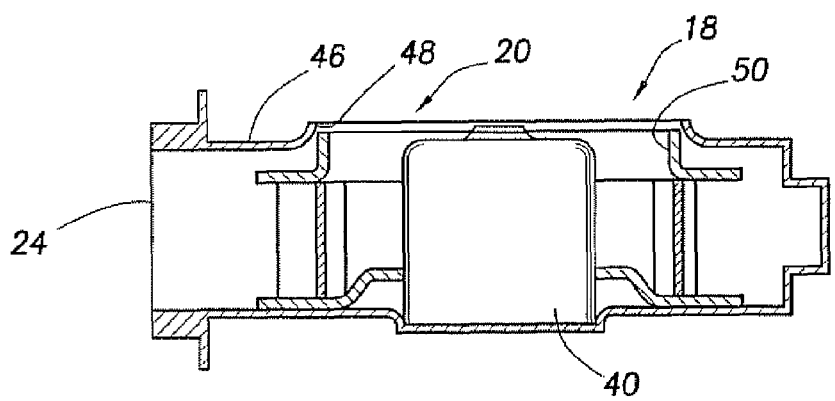
FIG. 5 shows a partial sectional view of the blower module of FIG. 3.

Referring now to FIG. 5, a partial sectional view of blower module 18 illustrates an exemplary embodiment of inlet 20. Inlet 20 is defined by the interaction of outer surface 46 and inlet ring 48 of module housing 36 and blower inlet 50. Inlet ring 48 projects from outer surface 46 to form a circular ring that surrounds blower inlet 50. Blower inlet 50 is recessed within inlet ring 48 such that air passes into the inlet ring before entering blower inlet 50.

In certain embodiments, the outer edge of inlet ring 48 extends past outer surface 46. By recessing outer surface 46, the total volume of blower housing 36, and therefore blower module 18, can be reduced. Reducing the total volume of blower module 18 may allow a greater number of modules to be installed into a given area or may allow greater spacing between adjacent modules. Increasing the space between adjacent modules provides more space for airflow into inlet 20, therefore decreasing the velocity of airflow between adjacent modules and resulting in a more evenly airflow distribution.

In other embodiments, a blower module may comprise a plurality of outlets that exhaust air in a plurality of directions. For example, a blower module may comprise two outlets that exhaust air from opposite sides of the blower's housing or may comprise three outlets arranged at sixty degree intervals around the blower's housing.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
    a chassis;
    a first electronic component disposed within said chassis;
    a second electronic component disposed within said chassis; and
    a multi-direction blower module comprising:
        a blower housing connected to said chassis and comprising an inlet, a first outlet, and a second outlet;
        a centrifugal blower rotatably mounted within said blower housing, wherein airflow into the inlet is passed in thermal communication with said first electronic component, airflow from the first outlet is passed in thermal communication with said second electronic device, and airflow from the second outlet is exhausted from said chassis; and
        an internal wall disposed within said blower housing, wherein said internal wall partially surrounds said blower.

2. The computer system of claim 1 wherein the inlet is disposed in an inlet surface, the first outlet is disposed in a first outlet surface, and the second outlet is disposed in a second outlet surface, wherein the inlet surface is perpendicular to the first and second outlet surfaces.

3. The computer system of claim 2 wherein the first outlet surface and the second outlet surface are perpendicular to each other.

4. The computer system of claim 2 wherein the inlet surface further comprises an inlet ring surrounding the inlet and extending from the inlet surface.

5. The computer system of claim 1 wherein the airflow from the first outlet has an outlet pressure that is not equal to an outlet pressure of the airflow from the second outlet.

6. The computer system of claim 1 further comprising a plurality of blower modules arranged in a parallel flow configuration.

7. A computer system comprising:
    a chassis supporting a first and second electronic component;
    a blower housing connected to said chassis and comprising an internal wall disposed within said blower housing;
    a centrifugal blower rotatably mounted within said blower housing, wherein said internal wall partially surrounds said blower;
    an inlet through said blower housing, wherein rotation of said blower generates an airflow into the inlet that is passed in thermal communication with the first electronic component before entering said blower housing;
    a first outlet through said blower housing, wherein rotation of said blower generates an airflow through the first outlet that is passed into said chassis and in thermal communication with the second electronic device; and
    a second outlet through said blower housing, wherein rotation of said blower generates an airflow through the second outlet that is exhausted from said chassis.

8. The computer system of claim 7 wherein said inlet is perpendicular to the first and second outlets.

9. The computer system of claim 8 wherein said first outlet and said second outlet are perpendicular to each other.

10. The computer system of claim 7 wherein said inlet comprises a blower inlet disposed on said blower housing and an inlet ring disposed on said blower housing.

11. The computer system of claim 10 wherein the inlet ring projects from an outer surface of said blower housing.

12. The computer system of claim 11 wherein the blower inlet is recessed within the inlet ring.

13. The computer system of claim 7 wherein the airflow from the first outlet has an outlet pressure that is not equal to an outlet pressure of the airflow from the second outlet.

14. The computer system of claim 7 further comprising a plurality of blower modules arranged in a parallel flow configuration.

15. A method for cooling a computer system comprising:
    providing a plurality of cooling modules, wherein each cooling module comprises a blower rotatably disposed within a blower housing having an internal wall disposed therein that partially surrounds the blower;
    disposing the plurality of cooling modules within a chassis supporting first and second electronic components;
    operating the plurality of cooling modules so as to generate an inlet airflow that passes in thermal communication with the first electronic component and through an inlet of each cooling module;
    generating a first outlet airflow from the plurality of cooling modules, wherein the first outlet airflow passes in thermal communication with the a second electronic component; and
    generating a second outlet airflow from the plurality of cooling modules, wherein the second outlet airflow is exhausted from the chassis.

16. The method of claim 15 wherein the inlet airflow is perpendicular to the first and second outlet airflows.

17. The method of claim 16 wherein the first outlet airflow and the second outlet airflow are perpendicular to each other.

18. The method of claim 17 wherein the plurality of cooling modules are arranged so that each of the second outlet airflows are parallel.

19. The method of claim 18 wherein the plurality of cooling modules are arranged so that each of the first outlet airflows are parallel.

20. The method of claim 15 wherein the first outlet airflow has an outlet pressure that is not equal to an outlet pressure of the second outlet airflow.

* * * * *

UNITED STATES PATENT AND TRADEMARK OFFICE
CERTIFICATE OF CORRECTION

PATENT NO. : 7,450,380 B2 Page 1 of 1
APPLICATION NO. : 11/552707
DATED : November 11, 2008
INVENTOR(S) : Robert B. Curtis et al.

It is certified that error appears in the above-identified patent and that said Letters Patent is hereby corrected as shown below:

In column 4, line 47, in Claim 15, after "the" delete "a".

In column 4, lines 60-61, in Claim 19, delete "airf lows" and insert -- airflows --, therefor.

Signed and Sealed this

Fourteenth Day of April, 2009

JOHN DOLL
*Acting Director of the United States Patent and Trademark Office*